PRECISION TRACKING OF ELECTRICALLY TUNED CIRCUITS

Filed Feb. 7, 1963 4 Sheets-Sheet 1

INVENTOR.
JOHN E. HARRISON
BY
T. L. Styner
ATTORNEY

May 3, 1966 J. E. HARRISON 3,249,876

PRECISION TRACKING OF ELECTRICALLY TUNED CIRCUITS

Filed Feb. 7, 1963

4 Sheets-Sheet 3

May 3, 1966 J. E. HARRISON 3,249,876

PRECISION TRACKING OF ELECTRICALLY TUNED CIRCUITS

Filed Feb. 7, 1963 4 Sheets-Sheet 4

United States Patent Office 3,249,876

Patented May 3, 1966

3,249,876

PRECISION TRACKING OF ELECTRICALLY TUNED CIRCUITS

John E. Harrison, Rochester, N.Y., assignor to General Dynamics Corporation, Rochester, N.Y., a corporation of Delaware Filed Feb. 7, 1963, Ser. No. 256,989
9 Claims. (Cl. 325—453)

This invention relates to electrically tuned circuits and is particularly directed to tuned circuits containing voltage responsive reactance elements.

The advantages of tuning a circuit with an adjustable control voltage instead of a movable core or condenser plate are obvious. The variable capacity of a reverse-biased semiconductor diode or the variable inductance of a coil on a saturable core with a D.C. control winding offer such advantages. Unfortunately, there are many problems adapting voltage responsive reactances to practical tunable circuits. First there is the problem of calibrating the control voltage in terms of frequency. The resonant frequency of any tuned circuit is a non-linear function of the reactances in the circuit. The reactance of diodes or coils are, in turn, non-linear functions of control voltage. Then, the control voltage source must be stabilized and the source and the reactance elements must be made immune to temperature and aging fluctuations. Next, a complex voltage divider circuit across the control voltage source is required to simulate the non-linear characteristics of the reactance elements in such a way as to permit linear frequency response. Finally, where two or more tunable circuits must track, individual trimming and padding adjustments are generally required.

An object of this invention is to provide an improved electrically tuned circuit.

A more specific object of this invention is to provide an improved electrically tuned circuit with a control voltage source which will obviate the disadvantages above enumerated.

The objects of this invention are attained in a tunable resonant circuit containing a voltage responsive reactance element. The control voltage for the reactance element is obtained from the discriminator of an automatic frequency control circuit of an oscillator. The frequency of the oscillator is determined by a tuned circuit containing a voltage responsive reactance element similar in all important respects with the reactance element to be controlled. The discriminator generates a direct current which is a function of the resonant frequency of the oscillator. If, now, the resonant frequency of the oscillator tends to drift for any reason, an incremental D.C. change in the discriminator output results which, when applied to the oscillator reactance element, stabilizes the oscillator. The same incremental D.C. change is applied to the reactance element of the tuned circuit to be controlled, so that the frequencies of the two tuned circuits are effectively locked together. Since the oscillator frequency can be selected, then the frequency of the circuit to be tuned is established. It follows that the frequency of the controlled circuit is no longer dependent upon absolute values of the direct current control voltage.

Other objects and features of this invention will become apparent to those skilled in the art by referring to the specific embodiments described in the following specification and shown in the accompanying drawings, in which.

Figure 1:
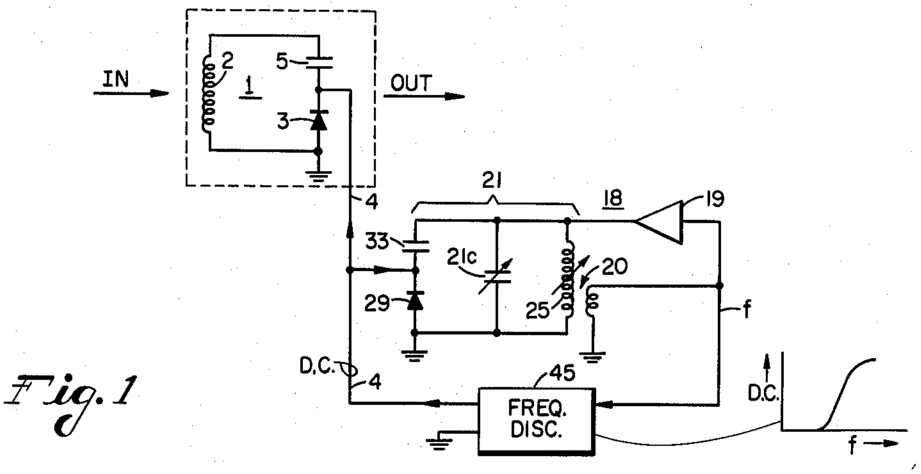
FIG. 1 is a schematic circuit diagram of one electrically tuned circuit of this invention.

The circuit to be electrically tuned, shown by way of example in FIG. 1 comprises the resonant tank circuit 1 including inductance 2 and the voltage responsive reactance element 3. The particular reactance element 3 shown is a capacitive diode of the semiconductor type, such as silicon, having highly mobile positive and negative charges, the positions of which can be changed with a variable back bias. One commercially obtainable voltage responsive diode is known as the "varicap" and may have an effective capacity across its terminals up to 500 or more micromicrofarads when reversely biased by a direct current voltage variable in a range below about 150 volts. The back bias in the example shown is applied through the lead 4, and ground. The blocking condenser 5 serves to open-circuit the direct current path through the coil winding 2. The capacity of the series blocking condenser is large compared to the variable capacitive reactance for tuning the circuit.

The direct current voltage for controlling the resonant frequency of circuit 1 is derived at the output of the frequency discriminator 45 connected to frequency source 18. The discriminator may be of any type which will produce a D.C. output, the amplitude of which is a function of applied frequency. The frequency source shown is the oscillator 18 comprising amplifier 19 and the frequency controlling tank circuit 21. Preferably, the parameters of the resonant circuit 21 are similar to, and have a tuning range comparable with, resonant circuit 1 and contain the voltage responsive reactance element 29 and the blocking condenser 33. Self-sustained oscillations are maintained by the regenerative feedback circuit including, in the example shown, the transformer coupling 20. According to this invention, the frequency of the source 18 is the independent variable of the system and is selected. The frequency of oscillation of oscillator 18 may be selected by any of many techniques. For example, the resonant frequency of the tank circuit 21 may be changed by the inductance 25, or by the tuning condenser 21*c*, or by gross changes, discussed below, in back bias of element 29.

The output of the discriminator is applied in parallel across elements 3 and 29. If, for any reason, the frequency of oscillation of oscillator 18 should tend to drift from the selected frequency, there results a corresponding incremental change in the direct current voltage on line 4 at the output of the discriminator. This change on line 4 is applied in the proper direction to the voltage responsive elements 29 to buck the frequency change. But, since reactance element 3 as well as 29 responds to the incremental change, the resonant frequency of resonant circuits 1 and 21 are effectively locked together, irrespective of the absolute values of direct current voltage appearing on line 4.

Figure 2:
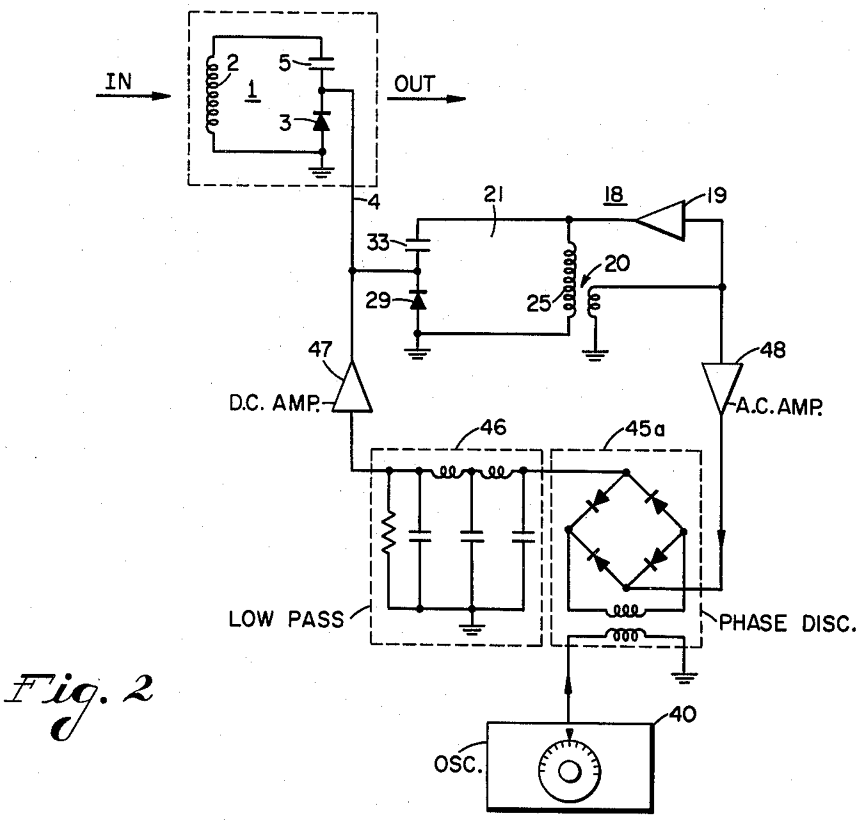
FIGS. 2 and 3 are schematic circuit diagrams of alternative means for selecting the frequency of operation of the circuits of FIG. 1.

Alternatively, the frequency of operation of oscillator 18 may be selected externally of the oscillator, as shown in FIG. 2. If the frequency of the oscillator is compared, in the phase discriminator 45*a*, with a frequency injected from the external source 40, the output direct current of the discriminator can be made a function of the difference between the two inputs to the discriminator, and the oscillator is entrained by the external source. The injection frequency may be continuously variable over the desired range as shown at 40 in FIG. 2, or may be changed in discrete steps as shown in FIG. 3.

In FIG. 2 the injection frequency is obtained from a conventional continuously tunable oscillator 40. There are no limitations on the circuit details of the oscillator and it may be of any type with a conventional calibrated tuning knob on the front panel. The phase discriminator 45a also may be of many types for comparing the phase of the output frequencies of oscillators 18 and 40. The particular phase discriminator shown in FIG. 2 comprises a four-sided bridge, each arm of which contains a diode. The diodes are so polarized that when the frequencies to be compared are applied, respectively, across the two diagonals of the bridge, there may be obtained a direct current containing a component of the difference frequency. The low-pass filter 46 is connected across the output of the discriminator 45a to pass the direct current and variably attenuate the difference frequency components. The particular low-pass filter shown comprises series inductances and parallel capacitances with a capacity input and a resistive output. The direct current output of the low-pass filter is preferably amplified in amplifier 47 to obtain control voltages throughout the entire operating range of the voltage responsive reactance elements 3 and 29. Conveniently, the gain of the amplifier 47 may be variable for this purpose. A.C. amplifier 48 should be connected between oscillator 18 and the input of the discriminator for isolation purposes.

The selected injection frequency applied to the phase discriminator 45a along with the output from oscillator 18 will yield a direct current which will tune the voltage responsive reactance element 29 to bring the oscillator into phase-locked relationship with the injection frequency. The bandwidth of resonant circuit 21 of oscillator 18 limits the range of injection frequencies within which the automatic frequency control circuit will capture control of the oscillator. For any particular wide range of injection frequencies, the tuning range of resonant circuit 21 may be extended as by switching in different portions of coil 25. If desired, the back bias of the voltage responsive diodes may be changed gross amounts with tapped potentiometers, which will be discussed below in connection with FIG. 5.

Figure 3:
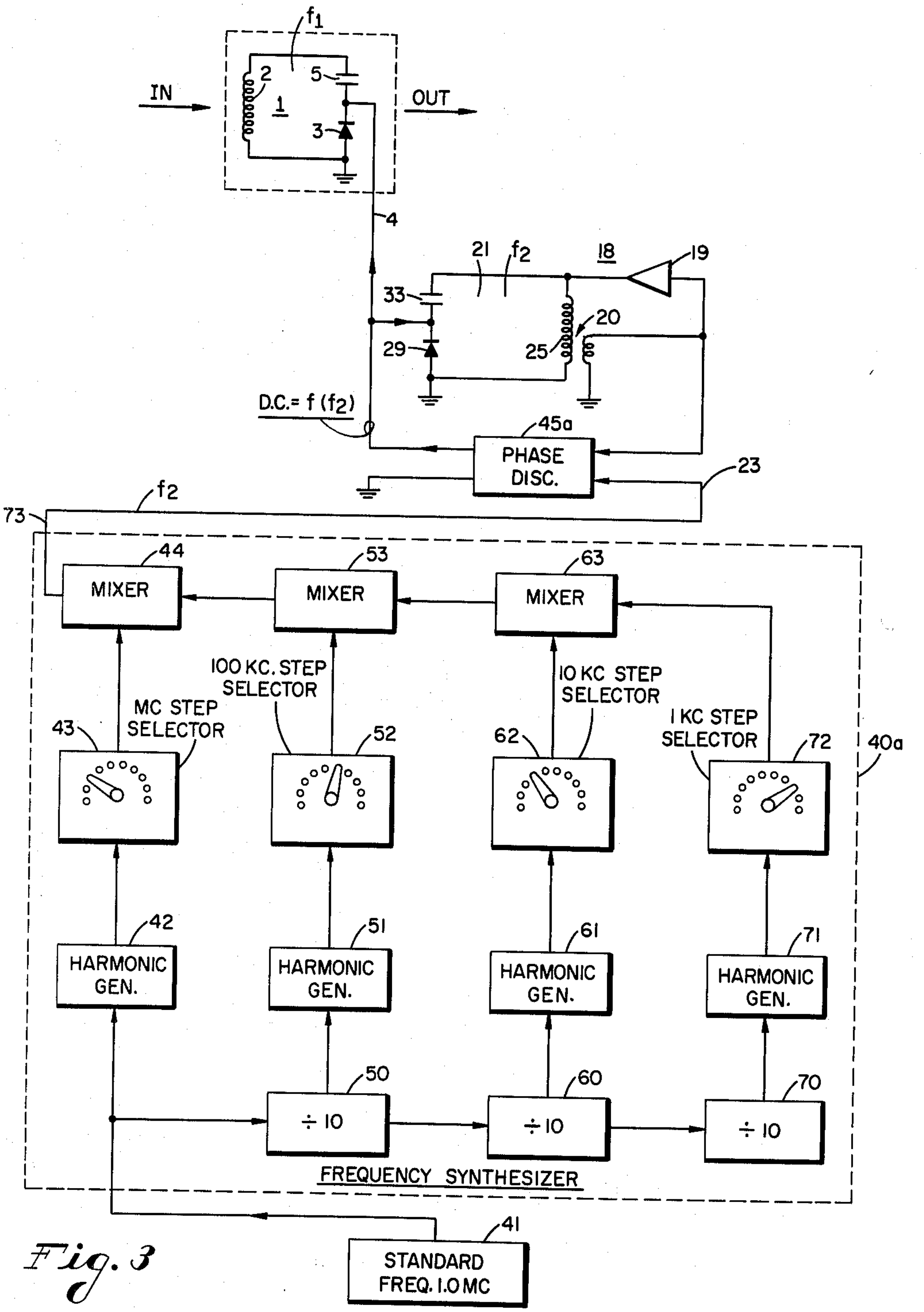

In FIG. 3 is shown the source 40a in which injection frequencies can be synthesized and can be adjusted in decimally-related steps of 1 kc., 10 kc., 100 kc. and 1 mc. with manually operated dials. The synthesizer source 40a is fed with a single frequency from an accurately controlled standard frequency source 41. For simplicity of description, let it be assumed that the standard frequency source is precisely fixed at 1.0 megacycles. The harmonic generator 42 will generate a series of harmonics precisely spaced 1 megacycle. The mc. step selector 43 will select any one of ten of the harmonics and apply the selected harmonic to one input of mixer 44. After dividing the standard frequency by a factor of ten in divider 50, harmonic generator 51 will generate a spectrum of harmonics spaced precisely 100 kc., and selector 52 can select any one of ten harmonic frequencies and apply it to mixer 53. Further division by ten of the standard frequency source at 60 will yield a spectrum of harmonics spaced 10 kc. apart in harmonic generator 61. Selector 62 picks any one of ten of the 10 kc. spectrum and applies the selected harmonic to mixer 63. Still further division in divider 70, harmonic generation in generator 71 and selection in selector 72, applies to mixer 63 any one of ten of the 1 kc. related harmonics. The output line 73 of mixer 44 contains all mixer products and any injection frequency adjustable in 1 kc. steps throughout the range limited only by the highest megacycle frequency available. Resonant circuit 21, being locked in phase with the injection frequency, likewise is adjusted throughout the range.

Figure 4:
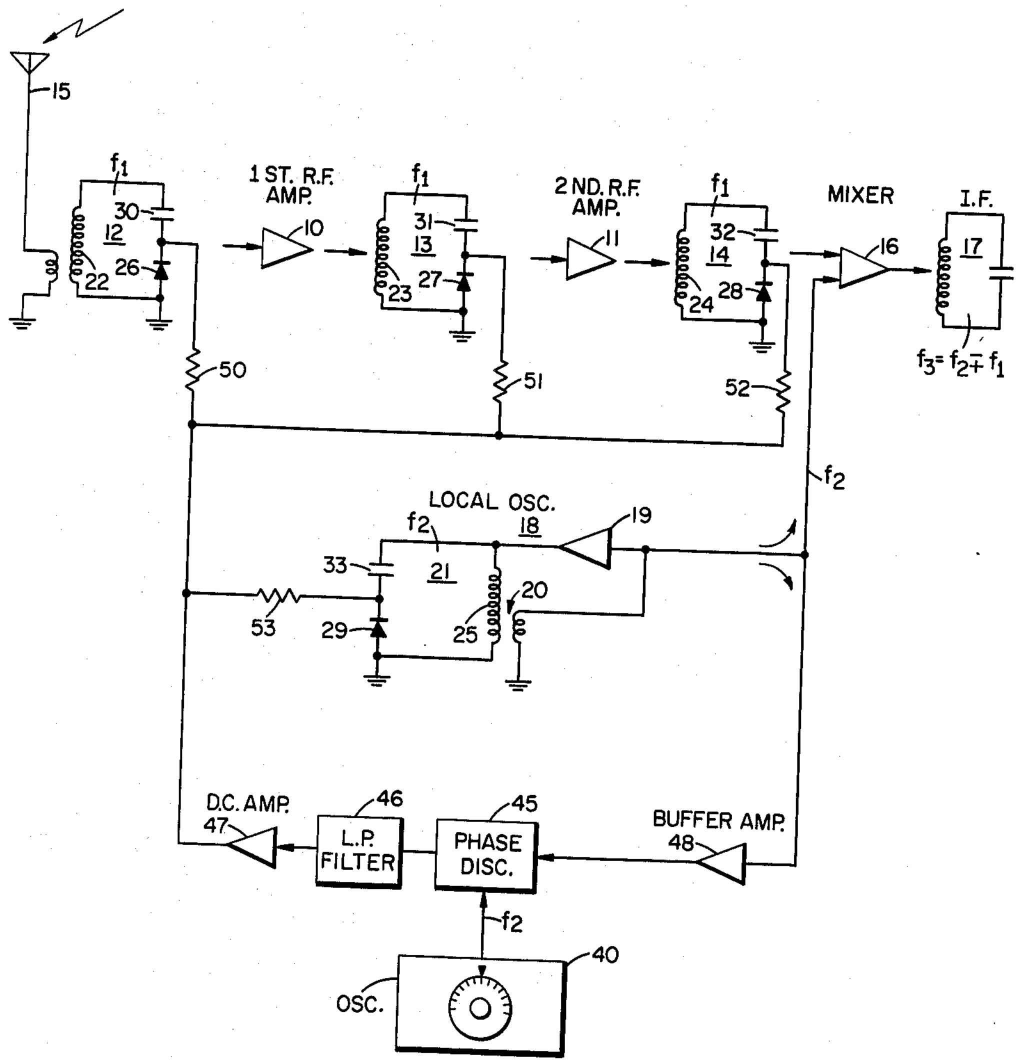
FIG. 4 is a schematic circuit diagram of one precision tracking circuit of this invention.

In FIG. 4 is shown one application of this invention to the frequency conversion scheme of a tunable heterodyne system of a high frequency transmitter or receiver where it is important that the local oscillator and RF tuned circuits be precisely tracked. It is assumed in the example shown that there are two cascaded RF amplifiers 10 and 11, each being tuned to frequency $f_1$ by one or more resonant tank circuits such as those shown at 12, 13 and 14. The first of the tuned amplifiers is coupled to an RF source such as the antenna 15, and the last of the cascaded amplifiers is coupled to the mixer 16. The output of the mixer is tuned by band-pass circuit 17 to pass a fixed narrow intermediate frequency band centered at $f_3$. According to an important feature of this invention, the second input of mixer 16 is obtained from the output of the phase-locked oscillator 18. If the oscillator 18 is tuned by the injection frequency from source 40 to frequency $f_2$, the intermediate frequency $f_3$ will be the sum or difference of $f_2$ and $f_1$.

The oscillator 18 for generating $f_2$ comprises amplifier 19 with feedback through transformer 20 coupled between the output and input of the amplifier to sustain free-running oscillations. As in FIG. 2, the frequency $f_2$ is determined by the resonant tank circuit 21, and the tank frequency is, in turn, controlled by the voltage responsive reactance element 29. The frequency-determining back bias voltage applied to element 29 is obtained from the phase discriminator 45. Low-pass filter 46, D.C. amplifier 47, and buffer amplifier 48 are employed, as in FIG. 2.

The resonant circuits 12, 13, 14 and 21 are similar, each including inductance and capacity and are adapted to be tuned through similar frequency ranges. Inductances 22, 23, 24 and 25 are in the tank circuits 12, 13, 14 and 21, respectively. The capacitive reactance elements of the tank circuits, which are capacity-diodes 26, 27, 28 and 29, are selected for their approximate similarities of bias-frequency characteristics. The resonant frequency of tank circuit 21 is displaced slightly, by the amount of the chosen IF, from the resonant frequency of the RF circuits, by appropriate trimming and padding condensers, not shown, or by slight adjustments of the tuning coils. The tuning knobs are calibrated in terms of the RF of circuits 12–14 rather than in terms of the injection frequency.

In the particular circuits of FIG. 4, the anode terminals of all capacity diodes are grounded and positive bias voltages are obtained from discriminator 45 and applied to the cathode terminals of the diodes. The blocking condensers 30, 31, 32 and 33 open circuit the direct current paths through the parallel tuning coils.

In operation, when the two frequency inputs to the phase discriminator 45 of FIG. 4 are equal, the output of the discriminator is a steady direct current. The phase of one discriminator input is displaced by a relatively steady amount from the phase of the other input. When the injection frequency is changed, as by the selection of a new frequency, the two inputs to the discriminator are momentarily different and a sinusoidal wave equal in frequency to the difference between the inputs is superimposed upon the D.C. output and is applied to the "varicap" 29. In the absense of first order integration in the D.C. circuits, this sinusoidal component is applied directly to the "varicap" 29, and to other voltage responsive reactance elements in the tuning circuits of the system. Since the "varicap" responds nearly instantaneously to changes in direct current bias, the frequency of response of the tuned circuit 21 wobbles at the difference frequency. If, now, the injection frequency from the source 40 is changed to some new value, the phase discriminator supplies a new D.C. bias to "varicap" 29 and wobbleations start and then decay, leaving the varicap with a new bias and with the tuned circuit 21 resonant to the new frequency dictated by the injection source 40. To reiterate, the direct current bias applied to the voltage responsive reactance 29 of the local oscillator is a function of the resonant frequency selected by the injection source and followed by the local oscillator. Any drift in frequency of the oscillator caused, say, by ambient conditions or by aging is immediately countered by correction of the bias voltage to the varicap 29 and by stabilization of the local oscillator.

The corrected direct current bias generated by the phase discriminator is also applied to varicaps 26, 27 and 28 of the RF tuning circuits. Isolating resistors 50, 51, 52 and 53 are placed directly in series with each varicap. Since the local oscillator has been displaced, as by padding and/or trimming condensers, to a frequency above or below the frequency of the RF circuits by an amount equal to the IF, any changes in oscillator frequency cause a corresponding change in RF frequencies to hold the IF constant. That is, the voltage applied to the RF amplifiers is governed by the oscillator, the frequency of which is selected, so that if the resonant frequency of the local oscillator 45 should drift the phase loop changes in D.C. control voltage to keep the frequency of the oscillator and of the RF circuits a fixed distance apart. Inasmuch as the IF is not a direct function of the D.C. voltages, absolute values of D.C. for tuning the RF and local oscillator need not be determined, stabilized, nor calibrated.

Figure 5:
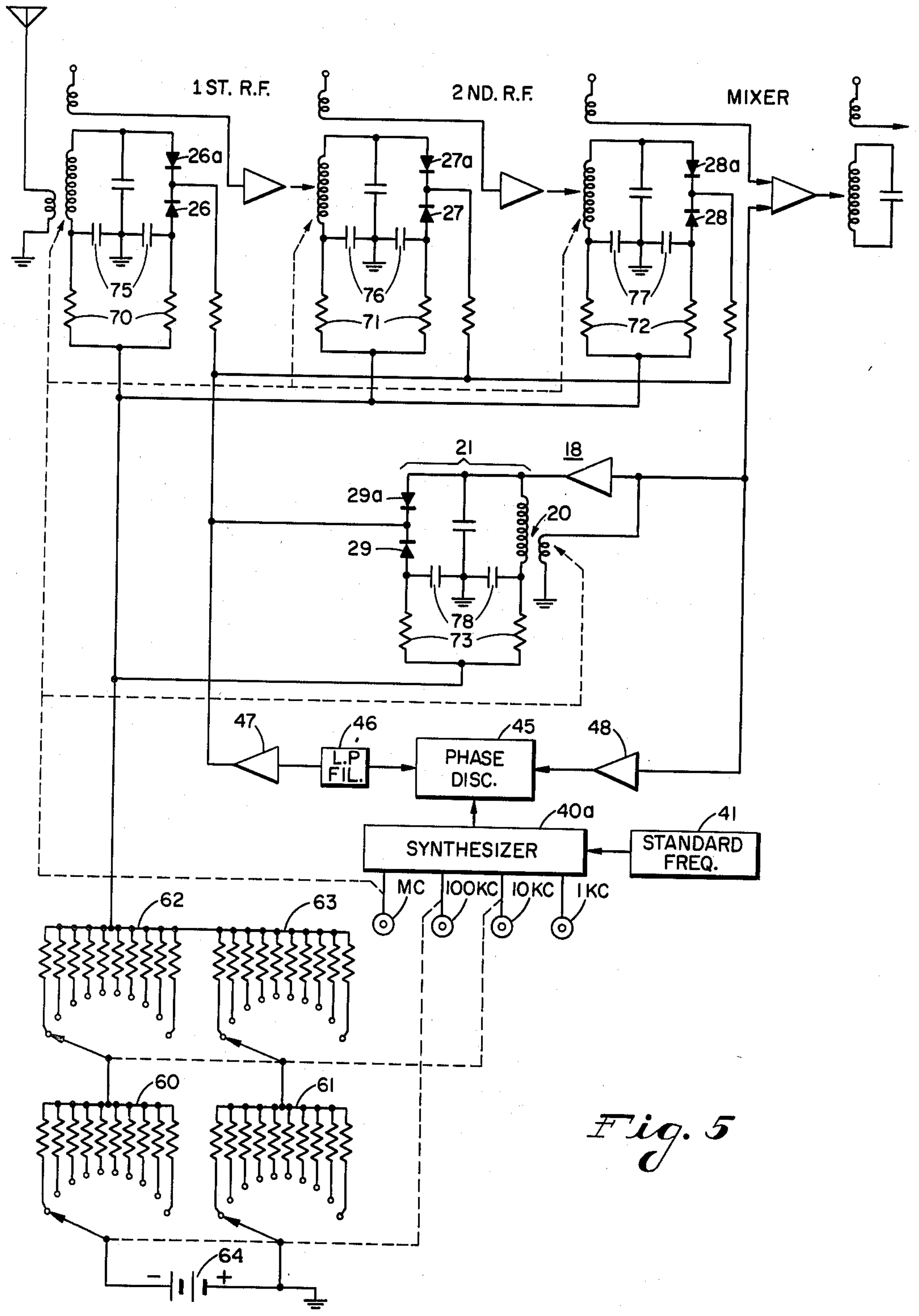
FIG. 5 is a schematic circuit diagram of another embodiment of precision tracking circuits of this invention.

According to another feature of this invention, the resonant circuits of the oscillator and of the RF amplifiers may be changed gross amounts to facilitate tuning of the frequency conversion system over wide ranges of frequencies. Referring to FIG. 5, potentiometers 60, 61, 62 and 63 are coupled between the voltage source 64 and the voltage sensitive reactance elements in the oscillator and RF circuits. Conveniently, the potentiometers 60–63 are tapped to provide decimally-related voltage steps in the bias circuit to produce decimally-related frequency changes. For example, resistors 60 and 61 may cause frequency steps of 100 kc. each, while resistors 62 and 63 may provide frequency steps of 10 kc. each. The moving contacts of the potentiometers may be ganged to the 100 kc. and the 10 kc. tuning knobs of the digital synthesizer 40*a*. The 1 mc. steps may be made by coil switching, not shown.

The gross biases applied to the varicaps 26 to 29 and 26*a* to 29*a* are applied through pairs of resistors 70, 71, 72 and 73 for coarse tuning. The back-to-back arrangement of tuning diodes provides a symmetry of circuit and reduced cross-modulaton products. Where the resistors 70–73 are connected to the anodes of the varicaps, as shown in FIG. 5, the ungrounded end of voltage source 64 will be negative. Fine tuning adjustments of the resonant frequencies are then conveniently applied as positive voltages to the cathode terminals of the "varicaps," and the circuits for coarse and fine tuning are effectively separated. Bypass condensers 75, 76, 77 and 78 permit RF grounding of one end of the tank circuits and prevent loading of the resonant circuits by the bias circuitry.

In operation, the band of frequencies desired is selected by the 1 mc. and the 100 kc. tuning knobs and fine tuning within each band is effected by the 10 kc. and 1 kc. tuning knobs. As stated, the D.C. bias generated by the automatic frequency control circuit of the oscillator keeps the RF and oscillator circuits in tracking condition, regardless of drift or absolute values of the D.C. bias.

The object of this invention to provide electrically tuned circuits which are precisely tuned for accurate tracking without troublesome stable voltage or current sources, without trimming adjustments, with simple voltage divider circuits and with no temperature compensation or stabilization is attained. Many modifications may be made in the circuit details of this invention without departing from the scope of the appended claims.

What is claimed is:

1. A system for tuning a resonant circuit comprising a first voltage responsive reactance element in said resonant circuit, a variable frequency oscillator, said oscillator including a tunable resonant frequency determining circuit operable to select the frequency of said oscillator, a second voltage responsive reactance element in said frequency determining circuit, a discriminator coupled to said oscillator for generating a control voltage the amplitude of which is a function of the oscillator frequency, and means for applying said control voltage to both of said first and second reactance elements to make the frequency of said first mentioned resonant circuit a dependent variable of the selected frequency of said oscillator.

2. In combination, a tunable circuit including a first voltage responsive reactance element, an oscillator, said oscillator having a frequency determining circuit containing a second voltage responsive reactance element, an adjustable frequency generator, an automatic frequency control circuit including a phase discriminator, said discriminator having two inputs coupled, respectively, to the output of said oscillator and to said generator, a low-pass filter coupled to the output of said discriminator to generate a control voltage which is a function of the frequency of said generator, and means for applying said control voltage to both of said first and second reactance elements.

3. A frequency converting system comprising a mixer with a fixed bandpass, two resonant circuits coupled to the input of said mixer each having a separate voltage responsive reactance element for controlling the resonant frequencies thereof, said elements being similar to each other, means for selecting the resonant frequency of one of said circuits, means for generating a control voltage which is a function of the selected resonant frequency of said one circuit, and means for applying said control voltage to said reactance elements of both of said circuits for tuning the second of said circuits so that the resonant frequencies of said two circuits track throughout a range of frequencies for generating the bandpass frequency of said mixer.

4. A heterodyne frequency converting system comprising a first and a second tunable circuit resonant, respectively, to frequencies $f_1$ and $f_2$, a mixer coupled to said circuits and responsive to $f_1$ and $f_2$ to produce a predetermined fixed intermediate mixer product, $f_3$; said tunable circuits each including a voltage responsive reactance element, an oscillator including said second tunable circuit, a source of control signals of variable frequency, phase discriminator means responsive to said control signals and to the output of said oscillator for generating a control voltage, said discriminator means being coupled to said reactance elements for applying said control voltage thereto so as to correspondingly vary $f_1$ and $f_2$ without changing $f_3$.

5. In an electric tuning system for a tunable resonant circuit including a first voltage responsive reactance element, the improvement comprising a tunable oscillator with a frequency determining circuit including a second voltage responsive reactance element, an automatic frequency control circuit coupled between the output of said oscillator and said second reactance element, said control circuit including a phase detector, a frequency synthesizer, said phase detector having two input circuits, one input circuit being coupled to said oscillator, the other input circuit being coupled to said frequency synthesizer, said synthesizer being of the type which generates decimally-related frequencies, and means for applying said control voltage to said first and second reactance elements to track the frequencies of said oscillator and said tunable circuit with the decimally-related frequencies generated by said synthesizer.

6. In combination in a frequency conversion system, a first resonant circuit including a first voltage responsive reactance element, a local oscillator including a tunable frequency determining resonant circuit containing a second voltage responsive reactance element, a mixer, means for coupling said first resonant circuit and the output of said oscillator to said mixer, an automatic frequency control circuit coupled to said oscillator for generating a control voltage which is a function of the oscillator frequency, and means for applying said control voltage to said first and second reactance elements so that the resonant frequency of said first circuit tracks the frequency of said oscillator to maintain constant the products of said mixer.

7. In combination in a frequency conversion system, a first tunable resonant circuit, a local oscillator including a second tunable circuit which controls the frequency thereof, a voltage responsive reactance element in each tunable circuit, a mixer coupled to said two tunable circuits for combining the output of said two tunable circuits. a potentiometer and a direct current voltage source connected to one terminal of each reactance element for making gross changes in resonant frequency of both tunable circuits, and means coupled to said oscillator for generating a fine control voltage which is a function of the frequency of said oscillator, and means for applying said fined voltage to the opposite terminals of each reactance element.

8. The combination defined in claim 7 further comprising a frequency synthesizer and a fixed stable frequency source, said synthesizer coupled to said source and including control means for changing the output frequency of said synthesizer in steps decimally related to the stable source frequency, and interlock means between said synthesizer control means and said potentiometer.

9. A frequency selecting system comprising a first tunable circuit including a first voltage responsive reactance element, a local oscillator including a second tunable frequency determining circuit with a second voltage responsive reactance element and, said oscillator having an automatic frequency control system coupled to the output of said oscillator for sampling the oscillator frequency, said automatic frequency control system including a stable fixed frequency source, a phase discriminator coupled to said oscillator and said source for generating a direct current control voltage which is a function of the frequency of said stable source, means for applying the generated discriminator voltage to said second reactance element to entrain the frequency of said oscillator, and means for applying the same generated discriminator voltage to said first reactance element to keep the resonant frequency of said first tunable circuit at a substantially fixed difference from the frequency of said second tunable circuit.

References Cited by the Examiner

UNITED STATES PATENTS

| | | | |
|---|---|---|---|
| 2,958,768 | 11/1960 | Brauer | 325—416 X |
| 3,029,339 | 4/1962 | Pan | 331—36 X |

ROBERT H. ROSE, *Primary Examiner.*

R. S. BELL, *Assistant Examiner.*